United States Patent [19]

Szabo et al.

[11] Patent Number: 5,458,999
[45] Date of Patent: Oct. 17, 1995

[54] INTERFEROMETRIC PHASE SHIFTING METHOD FOR HIGH RESOLUTION MICROLITHOGRAPHY

[76] Inventors: Gabor Szabo, H-6722, Szeged, Alfoldi u. 10, Hungary; Frank K. Tittel, 7315 Brompton #267B, Houston, Tex. 77025; Joseph R. Cavallaro, 3300 Belle Fontaine St. #17, Houston, Tex. 77025; Motoi Kido, 1111 Hermann Dr. #24, Houston, Tex. 77004

[21] Appl. No.: 82,243

[22] Filed: Jun. 24, 1993

[51] Int. Cl.$^6$ ........................................................ G03F 9/00
[52] U.S. Cl. .............................................. 430/5; 430/321
[58] Field of Search ................................... 430/5, 321

[56] References Cited

U.S. PATENT DOCUMENTS

| | | | |
|---|---|---|---|
| 4,514,857 | 4/1985 | Kimura et al. | 378/34 |
| 4,890,309 | 12/1989 | Smith et al. | 378/35 |
| 5,187,726 | 2/1993 | White | 378/35 |

FOREIGN PATENT DOCUMENTS 4-127150  4/1992  Japan.

OTHER PUBLICATIONS

Levenson, "What is a Phase–Shifting Mask?", SPIE vol. 1496 10th Annual Symposium on Microlithography (1990), pp. 20–26.
Burggraff, "Lithography's Leading Edge, Part 1: Phase–shift Technology," Semiconductor International, Feb. '92, pp. 42–47.
Schellenburg et al, "Real and Imaginary Phase–Shifting Masks," BACUS News—Photomask, Jan. '93, pp. 1–12.
Newmark et al, "Phase–shifting mask design tool", SPIE vol. 1604 11th Annual BACUS Symp. on Photomask Technology (1991), pp. 226–235.
Knight, "The Future of Manufacturing with Optical Microlithography," Optics & Photonics News, Oct. 1990, pp. 11–17.
Lin, "Phase–Shifting Masks Gain an Edge", Circuits and Devices, Mar. 1993, pp. 28–35.
Liu, "Systematic design of phase≧shifting masks with extended depth of focus and/or shifted focus plane", IEEE Trans. on Semicond. Mfgr, Feb. 93, pp. 1–21.

Primary Examiner—Steve Rosasco
Attorney, Agent, or Firm—John G. Graham

[57] ABSTRACT

A phase shifting method uses a special interferometer in which the illuminating beam is divided into two or more components and the mask is irradiated from both sides. The pattern to be transferred onto the wafer (the mask) is generated on an optically transmissive substrate by appropriately combining reflective, transparent and absorptive areas. The optical paths of the beams illuminating the back side and the front side of the mask (that will be called transmitted and reflected beams respectively) are chosen so that the phase of the two beams is different by approximately an odd multiple of π radians at the surface of the mask. The combined beams are projected onto the target wafer by suitable optics. The phase difference between the illuminating beams reduces the edge blurring that results from diffraction effects. This steepens the slope of the intensity profile at the edge of the features making it possible to achieve smaller feature sizes in the microlithographic replication without using those phase shifting elements of the conventional phase shifting method which made mask fabrication difficult. As a consequence of the lack of the phase shifting layers, the wavelength range of the method of this invention can easily be extended towards shorter wavelengths, and, further, the new mask is less vulnerable to optical damage. The additional freedom that the phase relation and intensity of the beams can be varied continuously allows for optimization that can lead to improved resolution, compared to conventional phase shifting techniques.

20 Claims, 6 Drawing Sheets

INTERFEROMETRIC PHASE SHIFTING METHOD FOR HIGH RESOLUTION MICROLITHOGRAPHY

BACKGROUND OF THE INVENTION

This invention relates to manufacture of semiconductor devices, and more particularly to a method of achieving phase shifting performance in high resolution microlithography.

Because of the higher level of integration in the design of recent DRAM (dynamic random access memory) chips, the required structure size of elements within the DRAM the circuit is decreasing. For example, a typical 4-Mbit DRAM requires 0.65 micron feature size, a 16-Mbit DRAM requires 0.5 micron and 64-Mbit requires 0.35 micron. The achievable feature size R projected on the silicon wafer by the conversion lens used in microlithography is limited by diffraction effects and is proportional to the wavelength L of the light source used, and a manufacturing parameter K, while it is inversely proportional to the numerical aperture NA of the lens, i.e.

$$R=KL/NA$$

So, there are three ways to decrease the structure size: (1) to use shorter wavelength light source, (2) to use higher NA lens, and (3) to improve the manufacturing parameter. The wavelength can be made shorter, for instance, by using an excimer laser with a wavelength of 248 mm, as compared to 365 nm which is the wavelength of the most widely used mercury lamp. High NA optical systems are under development. The phase shifting method improves the manufacturing parameter. The K value of the conventional method using a transparent mask has a theoretical lower limit of about 0.5. By using a phase shifting mask, however, it is possible to improve K down to 0.25. That means, by using the phase shift mask the resolution at the wafer can be improved by 100%, i.e. the minimal feature size can be half of that produced by the conventional method using the same wavelength and NA. Thus, the phase shifting technique has the potential to contribute to the production of higher density 256 Mbit and 1 Gbit DRAMs in the future.

Phase-shift masking is described by Levenson, "What is a Phase-Shifting Mask," SPIE Vol. 1496 10th Annual Symposium on Microlithography (1990), pp. 20–26, by Burggraff, "Lithograpy's Leading Edge, Part 1: Phase-shift Technology," Semiconductor International, February 1992, pp. 42–47, by Schellenburg et at, "Real and Imaginary Phase-Shifting Masks," BACUS News-Photomask, January 1993, pp. 1–12, and in U.S. Pat. No. 4,890,309 issued to Smith et al.

There are problems associated with state-of-the-art phase shifting masks as used in photolithography for semiconductor manufacture. These problems of the prior phase shifting mask technology are associated with the optical delay elements in the beam path. It is difficult to make phase shifting elements on the mask because very high geometrical precision is needed. It is also very difficult to achieve the exact thickness of the phase shifting elements that is required for the desired amount of phase shift. Furthermore, it is impossible to adjust the thickness of the phase shifting element once it is made. As a result of this the manufacturing cost of the masks is very high, which is one of the main problems in introducing phase shifting techniques into practical production lines. In addition, the damage threshold of the phase shifting element is relatively low compared to the substrate or other elements of the mask. This results in lower allowable exposure intensities, which in turn may limit the throughput of the whole production line. All of these problems become especially serious when the wavelength of the illuminating light is shortened.

SUMMARY OF THE INVENTION

In accordance with one embodiment of the invention, a phase shifting technique for masking in the manufacture of semiconductor devices uses a beam splitter to divide the beam into two or more components, and later these beams are combined at the mask surface where the transmitted beam forms the image of the mask, while the reflected part provides the phase shifted component in such a way that lengths of the optical path of the beams at the surface of the mask are different by half the wavelength of the beam. Using this new technique the same effect that improves the resolution of the phase shifting mask can be achieved but without using phase shifting elements on the mask. An additional advantage is that in contrast to conventional phase shifting techniques the intensity and phase of the phase shifted beam can be varied continuously which makes it possible to use an optimization procedure that can improve the resolution for some special structures, first of all for isolated features. The lack of phase shifting layers results in a much less complicated and less expensive mask technology. It is also not necessary to use low damage threshold special elements, so the mask has longer life time and can be exposed to higher intensities, resulting in higher throughput. Another very important advantage of the new technique is that it can be used with extremely short wavelengths, thereby increasing the resolution, and, further, this technique is wavelength independent, thus the same mask can be used with different wavelengths.

In particular, a phase shifting method uses a special interferometer in which the illuminating beam is divided into two or more components (by beam splitters) and the mask is irradiated from both sides. The pattern to be transferred onto the wafer (the mask) is generated on an optically transmissive substrate by appropriately combining reflective, transparent and absorptive areas. The optical paths of the beams illuminating the back side and the front side of the mask (that will be called transmitted and reflected beams, respectively) are chosen so that the phase of the two beams is different by approximately an odd multiple of $\pi$ radians at the surface of the mask. This means that the electric field of the reflected and transmitted beams have opposite signs and consequently they cancel each other when combined. The combined beams are projected onto the target wafer by suitable optics. The phase difference between the illuminating beams reduces the edge blurring that results from diffraction effects. This steepens the slope of the intensity profile at the edge of the features making it possible to achieve smaller feature sizes in the microlithographic replication without using those phase shifting elements of the conventional phase shifting method which made mask fabrication difficult. As a consequence of the lack of the phase shifting layers, the wavelength range of the method of this invention can easily be extended towards shorter wavelengths, and, further, the new mask is less vulnerable to optical damage. The additional freedom that the phase relation and intensity of the beams can be varied continuously allows for optimization that can lead to improved resolution, compared to conventional phase shifting techniques.

BRIEF DESCRIPTION OF THE DRAWINGS

The novel features believed characteristic of the invention are set forth in the appended claims. The invention itself, however, as well as other features and advantages thereof, will be best understood by reference to the detailed description of a specific embodiment, when read in conjunction with the accompanying drawings, wherein:

DETAILED DESCRIPTION OF SPECIFIC EMBODIMENT

Figure 1:
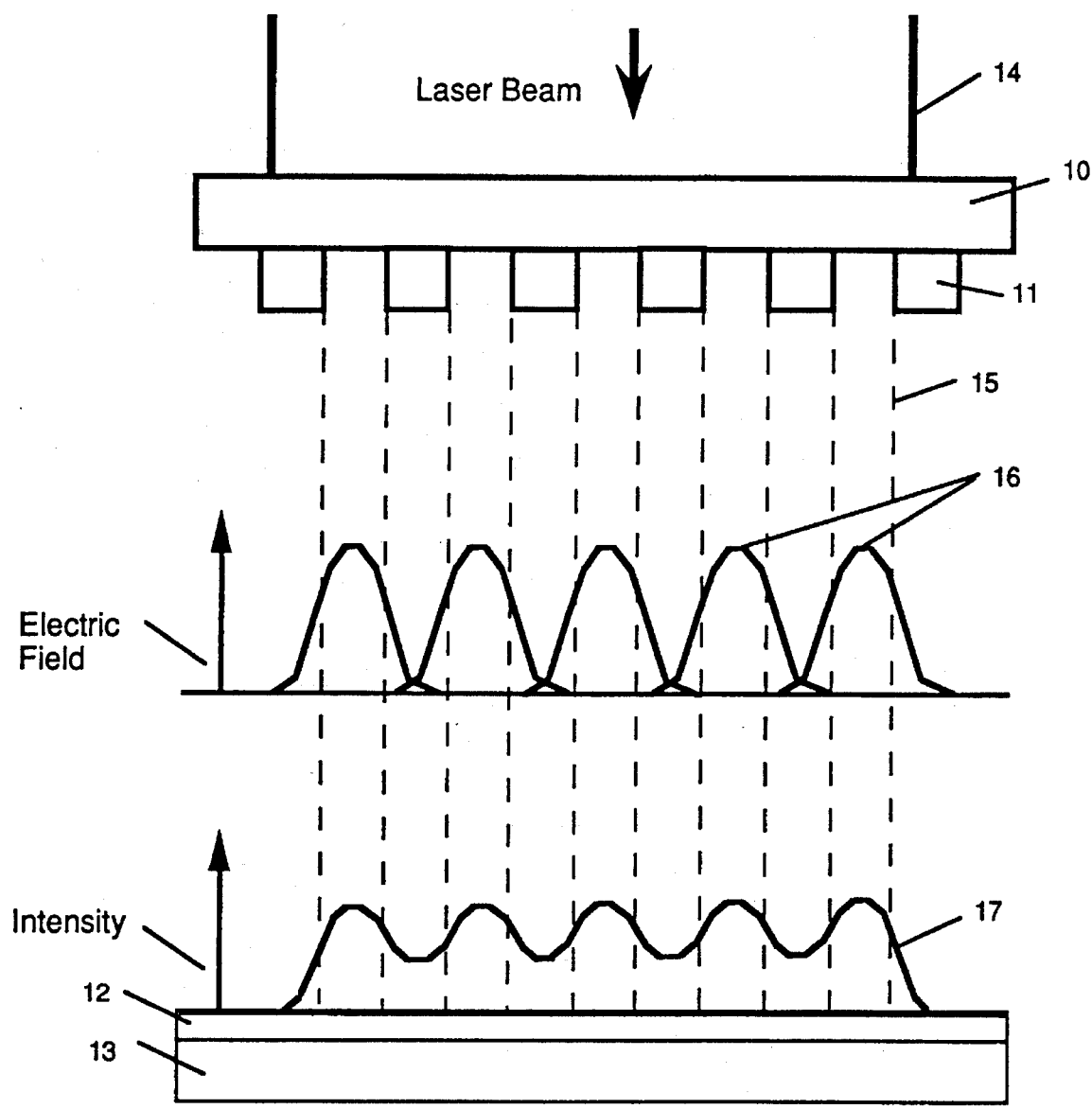
FIG. 1 is a diagram of a prior art mask method, to illustrate the problems associated with the conventional transparent mask.

Referring to FIG. 1, a conventional transmission mask 10 is shown, having a pattern 11 of opaque elements thereon corresponding to the pattern to be exposed in photoresist 12 on a semiconductor substrate 13. Note that conventional optics such as lenses are omitted in FIG. 1, as it is merely for illustrative purposes. A light beam 14 impinges upon the mask 10 and is selectively transmitted to produce a patterned beam 15 which exhibits an electric field illustrated by peaks 16. The intensity distribution of the laser light on the wafer surface is indicated by a line 17. The light passing through the neighboring transmissive elements of pattern 11 is diffracted into the areas that are intended to be dark (i.e. where the image of a bold feature is supposed to appear) where they overlap and consequently the contrast at the wafer is lost, as seen in the intensity distribution 17. The severity of this effect increases with decreasing feature size.

Figure 2:
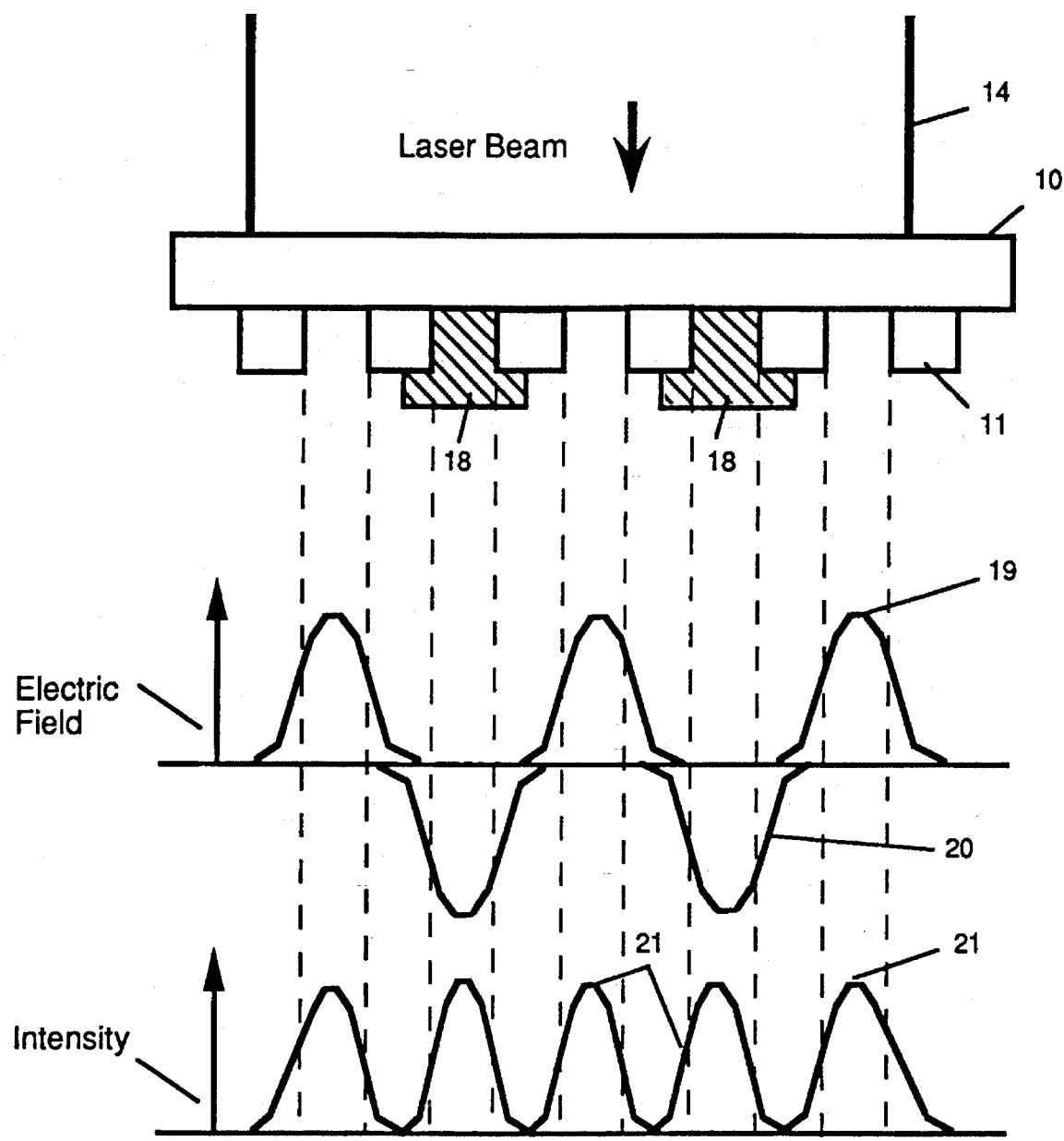
FIG. 2 is an elevation view in section of a prior art phase shifting microlithographic method.

Referring to FIG. 2, a diagram of the conventional phase shifting mask is illustrated, where the elements are the same as in FIG. 1 except phase shifting elements 18 are added. In the electric field distribution, peaks 19 and 20 are out-of-phase because one passes through a phase-shifting element 18 and the other does not, so the intensity of light on the wafer surface produces peaks 21 which are sharper. The diffraction effects cannot be eliminated, therefore the electrical field peaks 19 and 20 still overlap in the dark areas, but now with opposite sign because of the phase shifting elements 18 on the mask 10, so they cancel each other at the edges. As it can be seen from the intensity distribution with the peaks 21, this leads to higher resolution. As discussed above, however, there are problems in creating and using masks with the phase-shifting elements 18 added.

Figure 3:
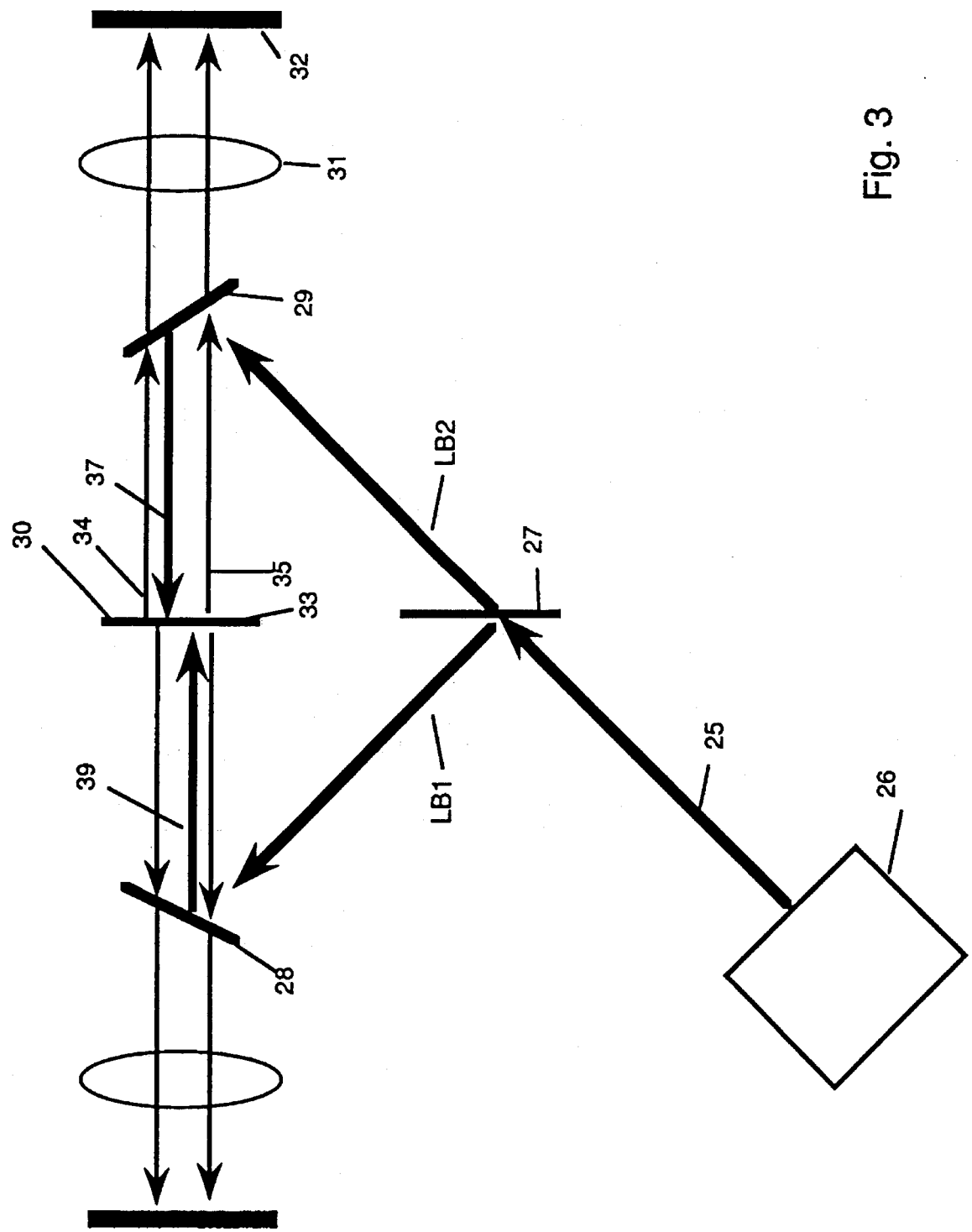
FIG. 3 is a diagram of an optical layout for a masking technique according to a preferred embodiment of the invention.

Referring now to FIG. 3, according to one embodiment of the invention, a light beam 25 is produced from a light source 26 of the type used in optical microlithography, preferably an UV laser beam. Beam splitters 27, 28 and 29 are beam splitting mirrors that split the incoming beam 25 into the desired ratio. The mask contains 30 the layout of the circuit to be made as a combination of reflective, transparent, and 50% reflecting (or absorbing) areas, as described below in reference to FIG. 4. An appropriate lens 31 is used to project a demagnified image of the mask 30 onto the photoresist coating on a top surface of the target wafer 32. The incident beam 25 is divided by beam splitter 27 into two beams LB1 and LB2 with a fixed intensity ratio, for example 1:1. The beam splitter 29 directs a part (25%) of the light of the beam LB2 coming from the splitter 27 towards the front surface 33 of the mask 30, and splitter 29 also transmits the phase shifted beam 34 coming from the mask 30 to the wafer 32. The second beam LB1 coming from splitter 27 is turned (again 25%) towards the back side of the mask 30 by splitter 28 and this beam as transmitted through the mask 30 continues as beam 35. (Splitter 28 can be replaced by a mirror, the advantage of using a beamsplitter at this position is that it automatically ensures the generally preferable 1:1 intensity ratio between the two beams, and at the same time, it provides a second port that is optically equivalent with the first one, providing that the optical effects caused by the substrate can be neglected, thus it can be used either for lithography or for control purposes.) Additional filters can be introduced into any of the two beam paths to optimize the intensity ratio of the two beams.

Figure 4:
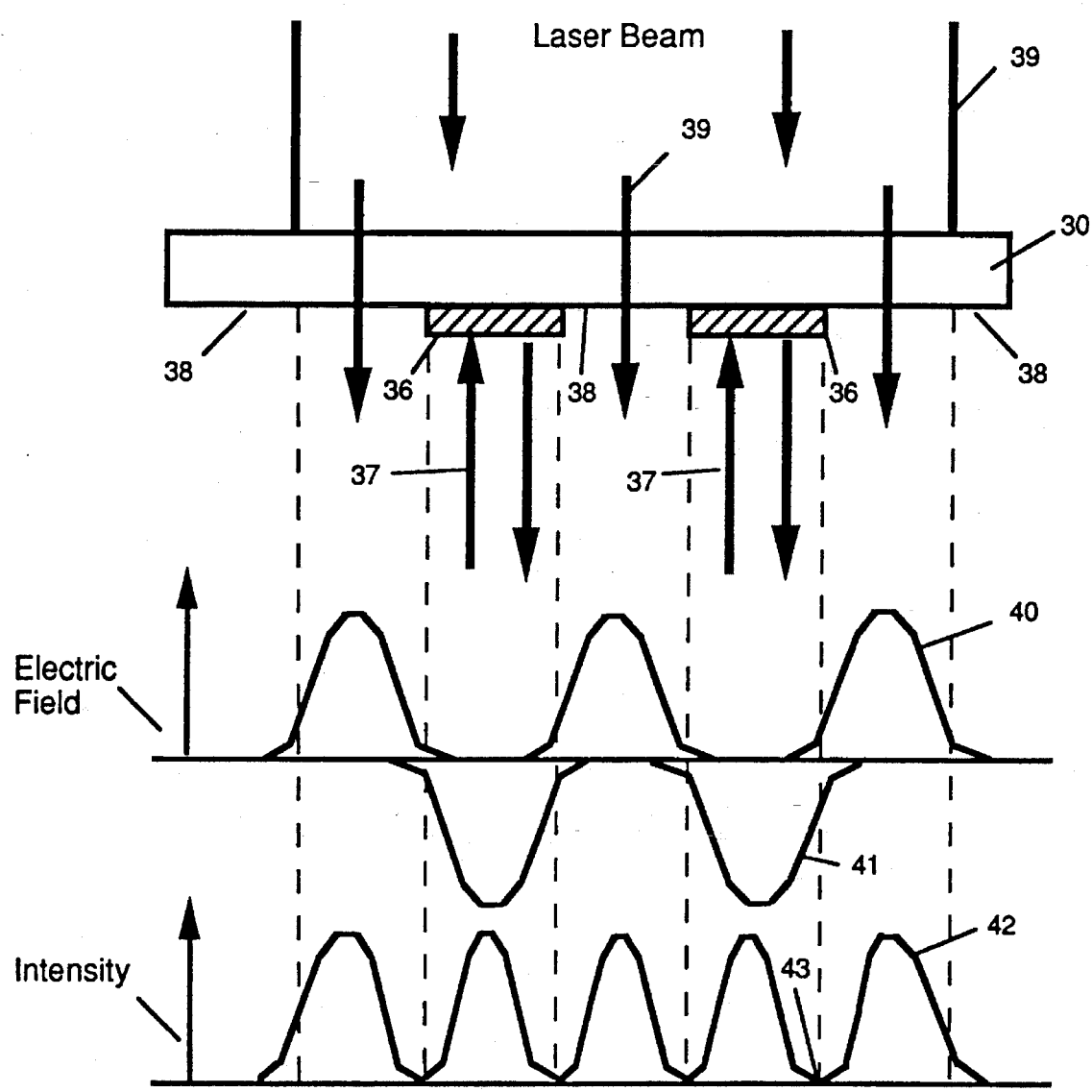
FIG. 4 is a diagram of a mask used in the system of FIG. 3, illustrating the principle of operation of the embodiment of FIG. 3.

The principle of operation of the method of FIG. 3 can be illustrated in reference to FIG. 4. Assume that the pattern on the mask 30 has a coated part 36 to reflect the beam 37 coming from splitter 29 and an uncoated part 38 to transmit the beam 39 coming from splitter 28. (The coating 36 can either be dielectric or metal coating.) The lengths of the optical paths of each beam 37 and 39 are chosen so that a phase shift of an odd multiple of $\pi$ radians occurs between these two beams. Interferometric contrast enhancement occurs at the edge of the coated parts because the electrical fields 40 and 41 of the diffraction pattern of the reflected beam 34 from the reflective coating 36 and the transmitted beam 35 are inverted, as seen, and therefore cancel each other. In the light intensity pattern 42 on the wafer, this results in an area 43 around the edges where the light intensity is almost zero which in turn leads to higher resolution. It is assumed that the lens 31 is located so that it forms a perfect image of the mask 30 on the top surface of the wafer 32. Note, however, that the density of peaks 42 is the same as the density of peaks 21 of FIG. 2, but the density of opaque areas 11 of FIG. 2 is twice the density of the reflective pattern 36 on the mask of FIG. 4. There is not a one-to-one correspondence between the pattern on the mask 30 of FIG. 4 and the pattern of peaks 42, and so the technique of the invention is best used where repetitive lines are to be created, as in memory devices.

To adjust the relative intensities of the various components of the light reaching to wafer 32 through the system of FIG. 3, using the features of the invention, there are three factors which allow control. First, the reflectivity of the elements 36 can be adjusted, such as by selecting the material used for the elements and varying the thickness of these elements on the mask 30. Second, the relative path lengths of the light beams passing through and reflected from the mask 30 can be adjusted mechanically by the set-up of the optical system, thus varying the amount of phase shift; usually this is a 180 degree difference between transmitted and reflected light. Third, the reflectivities of the splitters 27, 28, and 29 (ordinarily 50% or 1:1) can be selected to change the ratio of transmitted to reflected light at each instance.

Figure 5A:
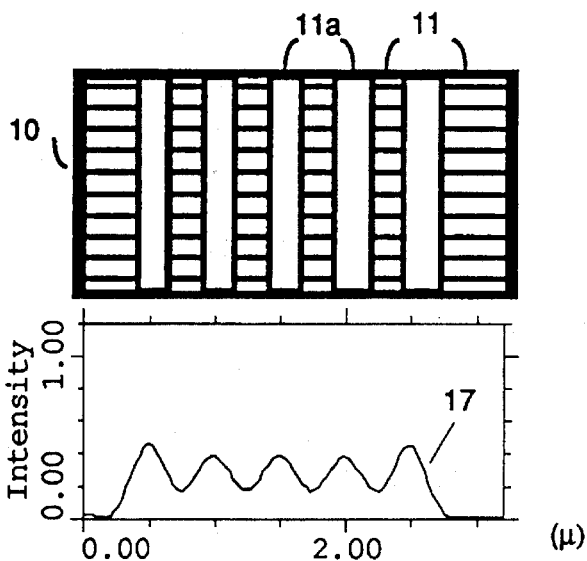
FIGS. 5a, 5b, and 5c are diagrams comparing the resolution of the prior art transmission method of FIG. 1, the conventional phase shifting method of FIG. 2, and the phase shifting method according to the invention as illustrated in FIGS. 3 and 4.
Figure 5B:
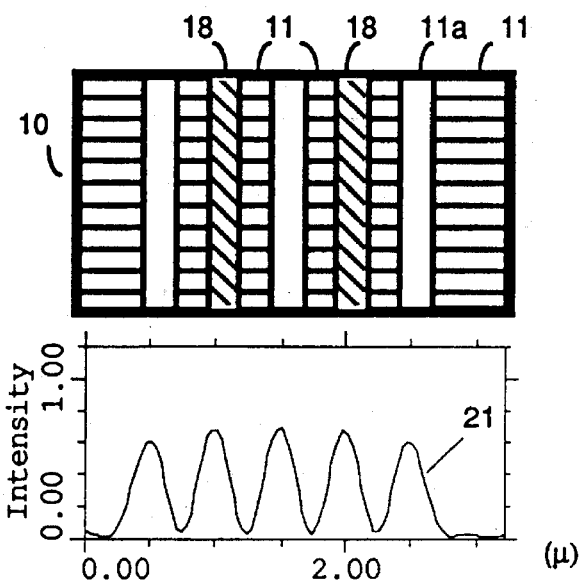
Figure 5C:
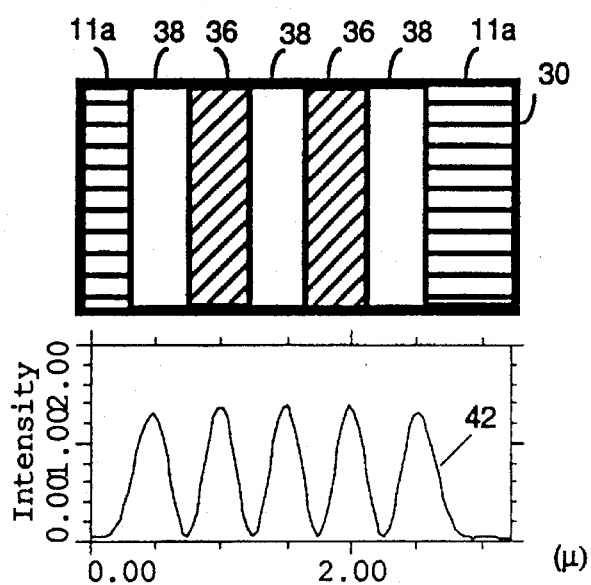

Referring to FIGS. 5a, 5b, and 5c, the calculated intensity distribution at the image plane for the different lithographic arrangements of FIGS. 1, 2, and 4, is illustrated. The parameters used in the calculations are that the wavelength is 248 nm, spatial coherence is 0.5, and the numerical aperture is 0.4. In FIG. 5a the calculated results corresponding to a conventional transmission mask of FIG. 1 are given, using opaque areas 11 and transparent areas 11a; as can be seen from the intensity distribution 17, the contrast on the wafer surface is very low. In FIG. 5b the calculated intensity distribution 21 on the wafer surface using a conventional phase shifting mask of FIG. 2 is illustrated, where opaque areas 11, transparent areas 11a, and phase-shifted areas 18 are present; the optical parameters are the same as that assumed for the transparent mask, and the increase in contrast in the intensity distribution 21 is obvious. In FIG. 5c the calculated results using the phase shifting technique of FIGS. 3 and 4, according to the invention, are illustrated. As in FIG. 4, the mask 30 has a circuit pattern thereon which includes reflective areas 36, transparent areas 38, and opaque areas 11a. Comparing FIGS. 5c and 5b, it can be seen that the new method provides the same high contrast in the peaks 42 of the intensity distribution as the conventional phase shifting masks. However, as noted above, the disadvantages of the conventional phase shifting masks are not present.

Figure 6A:
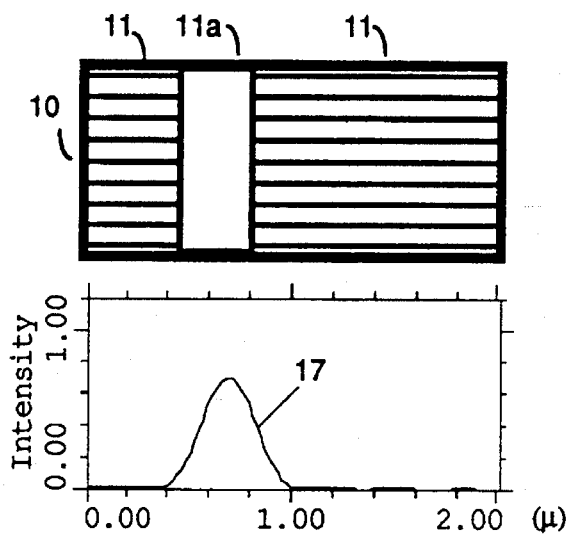
FIGS. 6a, 6b, and 6c are diagrams comparing the imaging features of the transmission method of FIG. 1, the conventional rim shifting, and the rim shifting method of the invention.
Figure 6B:
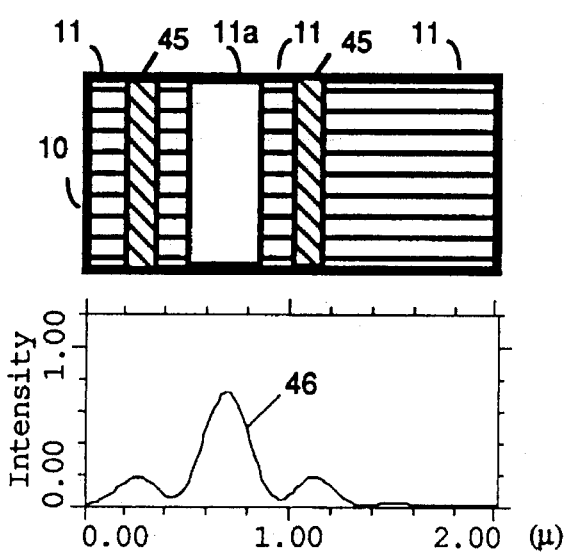
Figure 6B:
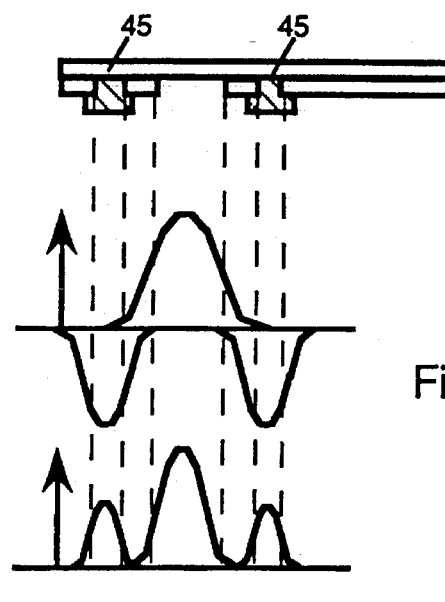
Figure 6C:
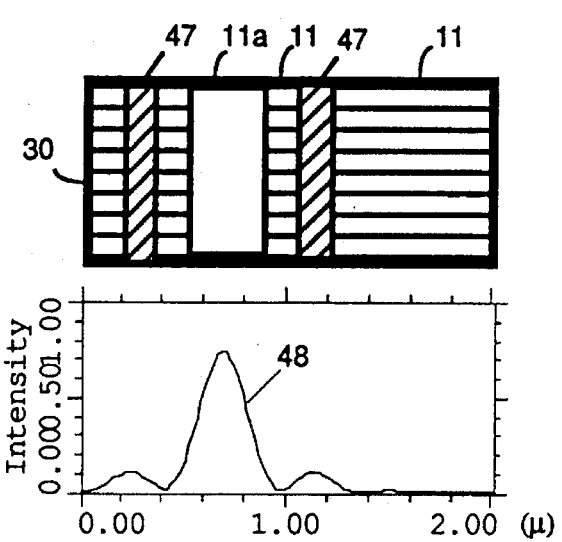
Figure 6C:
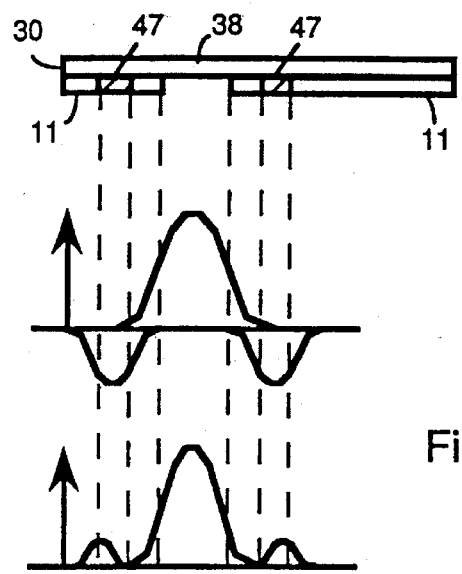

While the phase shifting technology is very suitable for periodic features (e.g., a regular pattern of parallel lines as in high-density memory products), to keep the resolution around the edges of larger isolated features requires the application of so-called rim shifters. The principle of rim shifters can be understood in reference to FIGS. 6a, 6b, and 6c. In the conventional transmission mask of FIG. 6a, a large transparent area 11a produces blurring at the edges, seen in the intensity profile 17. This blurring around the edges can be decreased by introducing narrow phase shifted stripes 45 in the vicinity of the boundary of the structure, seen in FIG. 6b. The stripes are composed of the same material as the phase shifting elements 18 of FIG. 2. If the width of the stripe 45 is chosen properly the contrast can be increased, as seen in the intensity distribution 46. In this method, however, the only adjustable parameter is width of the stripe 45 and the width and peak intensity of the diffracted beam change together. The phase shifting method according to the invention, however, offers a very important advantage, in that not only the width of the stripe but also the transmitted intensity can be controlled. This is illustrated in FIG. 6c where the performance of a rim shifter element 47 based on the improved technology is presented. Here the rim shifter 47 is a reflected area (like the element 36 of FIG. 4) producing a phase shift of 180 degrees. It can clearly be seen from the intensity profile 48 of FIG. 6c, where the "sidelobes" are lower, that the rim shifter 47 at a transmitted intensity level of 0.7 has higher contrast as compared to the conventional rim shifting method of FIG. 6b.

In summary, the present invention steepens the slope of the intensity profile at the edge of the features and makes it possible to get smaller features in the microlithographic replication without any phase shifting element 18 as was used in the conventional phase shifting method, and therefore it is easy to make the mask and to adjust the length of the optical path later.

While the invention has been described with reference to a specific embodiment, the description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments which fall within the true scope of the invention.

What is claimed is:

1. An optical microlithographic system, comprising:

a light source producing a light beam, first and second beam splitting elements directing said light beam simultaneously onto both front and back surfaces of a mask to produce transmitted light from said beam going through said mask from said front surface and producing reflected light from said beam from said back surface, beam combining elements receiving said reflected and said transmitted light from said mask, and means to direct light from said beam combing elements to a light-responsive surface.

2. A system according to claim 1 including means to adjust the length of the optical paths for said reflected and transmitted light to achieve maximum resolution.

3. A system according to claim 1, wherein the intensity of said reflected and transmitted light can be changed.

4. A system according to claim 1, wherein the mask has transparent and reflective areas.

5. A system according to claim 4, wherein the mask also has partially reflective and absorbing areas.

6. A system according to claim 1, wherein said light-responsive surface is on a semiconductor wafer.

7. An optical microlithographic method, comprising the steps of:

directing light from a single beam simultaneously toward both the front and back of a mask having transparent and reflective areas in a pattern to produce transmitted light going through the mask from the front and reflected light from the back of said mask;

combining said transmitted and reflected light from said mask and imaging said combined light onto a light-responsive surface.

8. A method according to claim 7 including the step of directing said light by at least one beam splitting element toward said mask.

9. A method according to claim 8 including the step of adjusting the relative intensity of said transmitted and reflected light to achieve interferometric edge-contrast enhancement.

10. A method according to claim 8 including the step of adjusting element of the length of the optical path of said transmitted and reflected light to achieve interferometric edge-contrast enhancement.

11. A method according to claim 7, including the step of adjusting the relative intensity of the illuminating beams.

12. A method according to claim 7, wherein said mask has transparent and reflective areas.

13. A method according to claim 12, wherein said mask has partially reflective areas.

14. A method according to claim 12, wherein said mask has absorbing areas.

15. A method according to claim 7, wherein said light-responsive surface is on a semiconductor wafer.

16. A mask for use in microlithography comprising:

a transmissive substrate for receiving a light beam from a single source and passing light from a front side through the substrate according to a pattern on said substrate;

a plurality of reflective areas on a back side of said substrate for reflecting light from said single source.

17. A mask according to claim 16, including:
a pattern of partially reflective areas on said substrate; and
a pattern of absorbing areas on said substrate.

18. A mask according to claim 16 in combination with means for directing light through said transmissive substrate and onto said reflective areas.

19. A mask according to claim 18 in combination with means for combining said light passing through said transmissive areas with light reflected from said reflective areas, and imaging combined light onto a light-responsive surface.

20. Apparatus according to claim 19 wherein said light-responsive surface is on a semiconductor wafer.

* * * * *